(12) United States Patent
Comsa et al.

(10) Patent No.: US 11,796,249 B2
(45) Date of Patent: Oct. 24, 2023

(54) SINGLE BUTTON CAPACITIVE USER INTERFACE

(71) Applicant: Electrolux Home Products, Inc., Charlotte, NC (US)

(72) Inventors: Cornel Comsa, Anderson, SC (US); Christian Detlefsen, Anderson, SC (US); Michael Melecci, Honea Path, SC (US); Matthew C. Bobinski, Anderson, SC (US)

(73) Assignee: Electrolux Home Products, Inc., Charlotte, NC (US)

( * ) Notice: Subject to any disclaimer, the term of this patent is extended or adjusted under 35 U.S.C. 154(b) by 267 days.

(21) Appl. No.: 17/314,598

(22) Filed: May 7, 2021

(65) Prior Publication Data

US 2022/0357100 A1 Nov. 10, 2022

(51) Int. Cl.
*F25D 23/12* (2006.01)
*F25D 29/00* (2006.01)
*G06F 3/044* (2006.01)

(52) U.S. Cl.
CPC ........... *F25D 29/005* (2013.01); *F25D 23/12* (2013.01); *G06F 3/0443* (2019.05); *F25D 2400/361* (2013.01); *F25D 2700/121* (2013.01)

(58) Field of Classification Search
CPC ......... F25D 2400/361; F25D 2700/121; F25D 29/005
See application file for complete search history.

(56) References Cited

U.S. PATENT DOCUMENTS

| 4,966,004 | A | 10/1990 | Midlang et al. |
| 7,827,811 | B2 * | 11/2010 | Ferragut, II ............ F25D 29/00 62/126 |
| 7,830,160 | B2 | 11/2010 | Philipp |
| 7,952,367 | B2 | 5/2011 | Philipp |
| 8,432,173 | B2 | 4/2013 | Philipp |
| 8,502,547 | B2 | 8/2013 | Philipp |

(Continued)

FOREIGN PATENT DOCUMENTS

| CN | 102235801 | | 11/2011 | |
| CN | 106963241 | A * | 7/2017 | ............ A47J 31/00 |

(Continued)

OTHER PUBLICATIONS

Machine Translation of WO2014046667 to Akiyoshi, "Virtual Knob Assembly", all (Year: 2014).*

(Continued)

*Primary Examiner* — Filip Zec
(74) *Attorney, Agent, or Firm* — Pearne & Gordon LLP

(57) ABSTRACT

Provided is a refrigeration appliance including a storage compartment, a user interface controller, and a user interface arranged in the storage compartment. The user interface is a stacked arrangement including a sensor assembly carrier, a graphic overlay, a light guide, and a printed circuit board (PCB) with a user interface controller and a self-capacitive electrode sensor. The main controller receives a signal from the user interface with self-capacitive electrode sensor and adjusts the temperature of the storage compartment based on the signal from the self-capacitive electrode sensor. A method controlling a refrigeration appliance with a stacked user interface is also provided.

20 Claims, 8 Drawing Sheets

(56) References Cited

U.S. PATENT DOCUMENTS

| | | | |
|---|---|---|---|
| 9,766,705 B2* | 9/2017 | Chan | G06F 3/0362 |
| 10,330,380 B2 | 6/2019 | Park | |
| 10,359,227 B2 | 7/2019 | Park | |
| 10,495,371 B2 | 12/2019 | Yang et al. | |
| 10,598,429 B2 | 3/2020 | Kaymak et al. | |
| 10,619,915 B2 | 4/2020 | Park | |
| 2003/0066827 A1* | 4/2003 | Daum | F24C 7/082 |
| | | | 99/468 |
| 2008/0094077 A1 | 4/2008 | Philipp | |
| 2014/0196711 A1* | 7/2014 | Frommer | F24C 7/087 |
| | | | 126/39 BA |
| 2016/0071652 A1* | 3/2016 | Lyszus | H01G 5/01 |
| | | | 361/287 |
| 2016/0239142 A1* | 8/2016 | Kim | G04G 21/08 |
| 2016/0364059 A1 | 12/2016 | Chan et al. | |
| 2017/0097187 A1* | 4/2017 | Thea | F25D 27/005 |
| 2019/0109723 A1* | 4/2019 | Ebrom | H05B 6/688 |
| 2020/0025439 A1 | 1/2020 | Yang et al. | |
| 2021/0086617 A1* | 3/2021 | Jeon | B60K 37/06 |

FOREIGN PATENT DOCUMENTS

| | | | |
|---|---|---|---|
| CN | 110671882 | 1/2020 | |
| EP | 2898600 | 7/2015 | |
| JP | 3370910 | 4/1999 | |
| KR | 20090106933 A * | 10/2009 | F25D 29/005 |
| KR | 20100025711 | 3/2010 | |
| WO | 2015159473 | 10/2015 | |
| WO | 2016204901 | 12/2016 | |

OTHER PUBLICATIONS

International Search Report for PCT/US2022/026295, dated Aug. 12, 2022, 14 pages.

* cited by examiner

SINGLE BUTTON CAPACITIVE USER INTERFACE

CROSS-REFERENCE TO RELATED APPLICATIONS

Not applicable.

FIELD OF INVENTION

This application relates generally to a refrigeration appliance, and more particularly, to a capacitive user interface for a refrigerator.

BACKGROUND OF INVENTION

Refrigeration appliances, such as domestic refrigerators, have at least one temperature-controlled compartment in which food items can be stored at temperatures below room temperature. A user interface is traditionally provided within the temperature-controlled compartment to allow the user to select a desired target temperature for that temperature-controlled compartment. The user interface of conventional refrigerators has a manually turned knob that sets the desired temperature with a potentiometer (e.g., variable resistor). However, this system is analog and the potentiometer typically provides no indication of the level of the temperature set point. Instead, the knob and the respective housing are aligned and marked relative to the adjustment of the potentiometer to provide a visual indication to the user of a general selected set point, such as cold, colder and coldest; thus, providing minimal feedback to the user. In addition, the manually turned knobs eventually wear out because they employ moving parts. Therefore, it is desirable to provide a reliable user interface that provides better feedback to the user.

BRIEF SUMMARY OF THE INVENTION

The Summary is as follows.

In accordance with one aspect, there is provided a refrigeration appliance including a storage compartment, a controller, and a user interface arranged in the storage compartment. The user interface comprising a stacked arrangement including a sensor assembly carrier, a graphic overlay, a light guide, and a printed circuit board (PCB) with a self-capacitive electrode sensor. The controller is configured to receive a signal from the self-capacitive electrode sensor, and adjust the temperature of the storage compartment based on the signal from the self-capacitive electrode sensor.

In the refrigeration appliance according to the foregoing aspect, the user interface further comprises a single capacitive touch button configured to be manipulated by a user for controlling a temperature of the storage compartment. The self-capacitive electrode sensor is operatively connected to the single capacitive touch button.

In the refrigeration appliance according to the foregoing aspect, the PCB comprises electrical circuitry for receiving user input via the single capacitive touch button and transmitting the user input via a communication channel to the controller for controlling an operation of a refrigeration system that provides a cooling effect to an interior of the storage compartment.

In the refrigeration appliance according to the foregoing aspect, an electrical connector is attached to a rear side of the PCB for supplying power and for providing data connection to the PCB and to the single capacitive touch button.

In the refrigeration appliance according to the foregoing aspect, the user interface further comprises a plurality of light-emitting diode (LED) indicators configured to display at least one of a temperature setting for the storage compartment or a special mode of the refrigeration appliance.

In the refrigeration appliance according to the foregoing aspect, the special mode of the refrigeration appliance is a Sabbath mode.

In the refrigeration appliance according to the foregoing aspect, the controller is further configured to evaluate the signal from the self-capacitive electrode sensor and illuminate at least one of the plurality of LED indicators corresponding to the temperature setting for the storage compartment or to the special mode of the refrigeration appliance.

In the refrigeration appliance according to the foregoing aspect, the stacked arrangement of the user interface further comprises a transparent outer panel and at least one LED indicator arranged below the transparent panel.

In the refrigeration appliance according to the foregoing aspect, the PCB is jointly received within an inner circumference of the sensor assembly carrier.

In the refrigeration appliance according to the foregoing aspect, the sensor assembly carrier is configured to be snapped into a housing arranged in the storage compartment.

In the refrigeration appliance according to the foregoing aspect, the stacked arrangement further includes a capacitive touch spring configured to be arranged between the light guide and the PCB so that the capacitive touch spring contacts the light guide.

In the refrigeration appliance according to the foregoing aspect, the capacitive touch spring is configured to be accommodated inside a groove formed in the light guide and to extend to a front portion of the light guide, said front portion facing the graphic overlay.

In the refrigeration appliance according to the foregoing aspect, the sensor assembly carrier has a cylindrical shape, wherein a plurality of spring clips are arranged about an outer periphery of the sensor assembly carrier.

In the refrigeration appliance according to the foregoing aspect, the sensor assembly carrier includes at least one locating rib configured to align the PCB, the light guide, and the graphic overlay parallel to a front face of the sensor assembly carrier.

In accordance with another aspect, there is provided a method for controlling a refrigeration appliance including a storage compartment, a controller, and a stacked user interface including a single capacitive touch button and a plurality of light-emitting diode (LED) indicators. The method includes consecutively touching, by a user's finger, the single capacitive touch button to select at least one of a temperature setting or a special mode setting for the storage compartment; interpreting, by the controller, signals from the single capacitive touch button, to determine and activate a desired temperature setting or a special mode setting for the storage compartment; and energizing, by the controller, at least one LED indicator of the plurality of LED indicators to visualize a selected temperature setting or special mode setting for the storage compartment. Each successive touch by the user's finger corresponds to a predetermined temperature set point or special mode setting, and energizes at least one successive corresponding LED indicator on the stacked user interface.

In the method for controlling a refrigeration appliance according to the foregoing aspect, each predetermined temperature set point corresponds to a different shade of color or intensity of illumination of the at least one successive corresponding LED indicator.

In the method for controlling a refrigeration appliance according to the foregoing aspect, the special mode is a Sabbath mode.

In the method for controlling a refrigeration appliance according to the foregoing aspect, the controller activates or deactivates the Sabbath mode in response to a continuous pressing, by the user's finger, of the single capacitive touch button, for a predetermined time duration.

Other features and aspects may be apparent from the following detailed description, the drawings, and the claims.

BRIEF DESCRIPTION OF THE DRAWINGS

The foregoing and other aspects of the present disclosure will become apparent to those skilled in the art to which the present disclosure relates upon reading the following description with reference to the accompanying drawings, in which.

Figure 1:
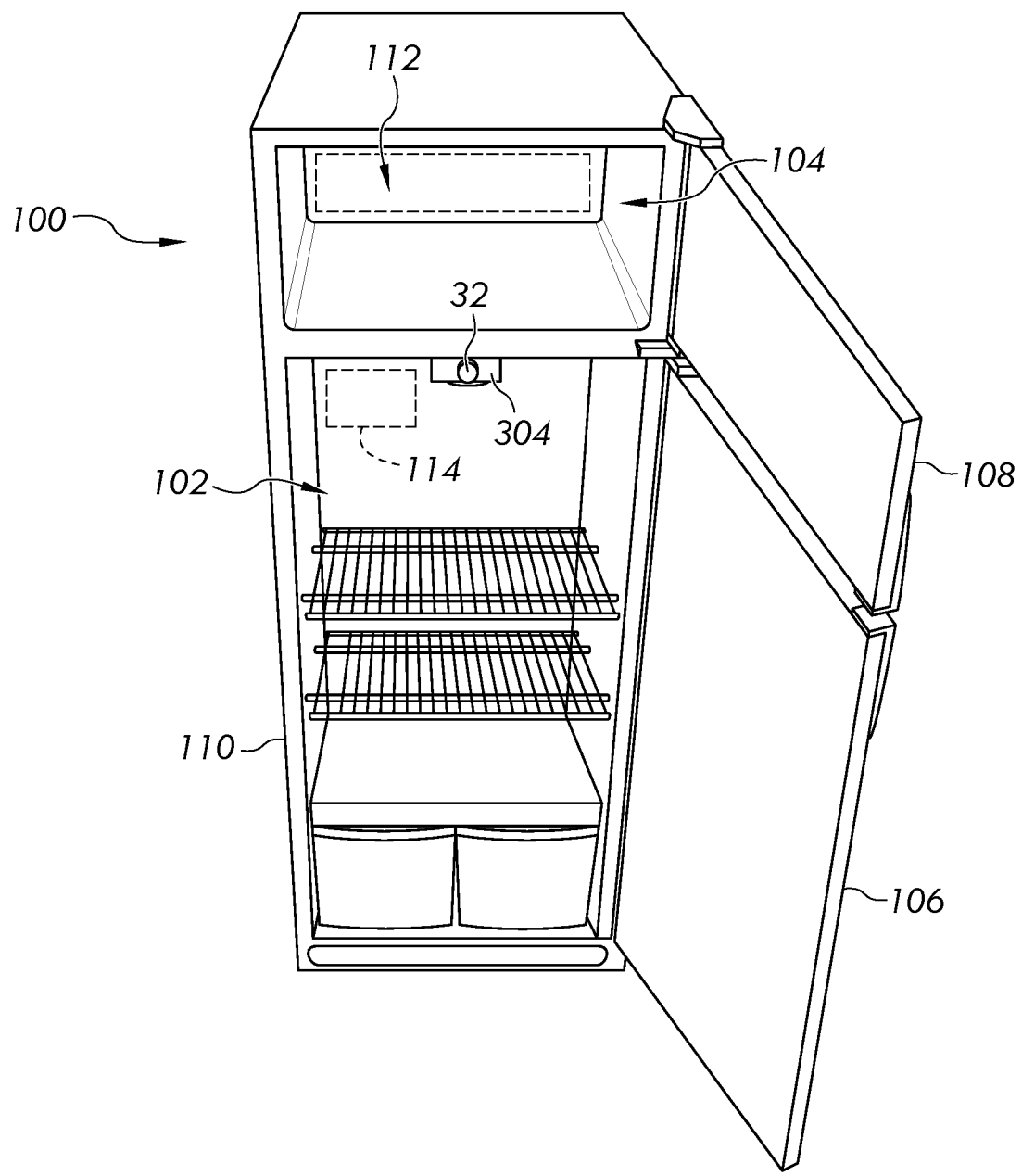
FIG. 1 is a front perspective view of an example top mount refrigerator (freezer disposed above the fresh food compartment) showing doors of the refrigerator in an opened position.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Example embodiments that incorporate one or more aspects of the apparatus and methodology are described and illustrated in the drawings. These illustrated examples are not intended to be a limitation on the present disclosure. For example, one or more aspects of the disclosed embodiments can be utilized in other embodiments and even other types of devices. Moreover, certain terminology is used herein for convenience only and is not to be taken as a limitation.

Conventional refrigeration appliances, such as domestic refrigerators, typically have both a fresh food compartment and a freezer compartment or section. The fresh food compartment is where food items such as fruits, vegetables, and beverages are stored and the freezer compartment is where food items that are to be kept in a frozen condition are stored. The refrigerators are provided with a refrigeration system that maintains the fresh food compartment at temperatures above 0° C., such as between 0.25° C. and 4.5° C. and the freezer compartments at temperatures below 0° C., such as between 0° C. and −20° C.

The arrangements of the fresh food and freezer compartments with respect to one another in such refrigerators vary. For example, in some cases, the freezer compartment is located above the fresh food compartment and in other cases, the freezer compartment is located below the fresh food compartment. Additionally, many modern refrigerators have their freezer compartments and fresh food compartments arranged in a side-by-side relationship. Whatever arrangement of the freezer compartment and the fresh food compartment is employed, typically, separate access doors are provided for the compartments so that either compartment may be accessed without exposing the other compartment to the ambient air.

Such conventional refrigerators are often provided with a unit for making ice pieces, commonly referred to as "ice cubes" despite the non-cubical shape of many such ice pieces. For refrigerators such as the so-called "bottom mount" refrigerator, which includes a freezer compartment disposed vertically beneath a fresh food compartment, the ice making unit is arranged in the fresh food compartment. Alternatively, the ice making unit may be located in the freezer compartments of the refrigerators and manufacture ice by convection, i.e., by circulating cold air over water in an ice tray to freeze the water into ice cubes. Storage bins for storing the frozen ice pieces may be provided adjacent to the ice making units. The ice pieces can be dispensed from the storage bins through a dispensing port in the door that closes the fresh food compartment or the freezer to the ambient air. The dispensing of the ice usually occurs by means of an ice delivery mechanism that extends between the storage bin and the dispensing port in the respective compartment door.

The cooling/refrigeration system of a refrigerator cools the storage compartments (e.g., the freezer, fresh-food compartment, and/or the ice maker) of the refrigerator. The refrigeration system can include either a standard compressor or a variable speed compressor, a condenser, a condenser fan, and an evaporator connected in series and charged with a refrigerant from the compressor, and an evaporator fan. The evaporator fan circulates cooling air through the refrigerator compartments and improves heat transfer efficiency. The condenser expels heat withdrawn by the evaporator from the fresh food compartment and the freezer compartment, respectively.

Referring now to the drawings, FIG. 1 shows a refrigeration appliance in the form of a domestic refrigerator, indicated generally at 100. Although the detailed description that follows concerns a domestic refrigerator 100, the invention can be embodied by refrigeration appliances other than a domestic refrigerator 100. For example, the various embodiments of the user interface (discussed below) can be embodied in various other appliances. Further, an embodiment is described in detail below, and shown in the figures as a top-mount configuration of a refrigerator 100, including a fresh-food compartment 102 disposed vertically below a freezer compartment 104. Still, it is to be understood that the refrigerator can have any desired configuration including at least a fresh-food compartment and/or a freezer compartment, such as a bottom mount refrigerator (freezer disposed beneath the fresh food compartment), a side-by-side refrigerator (fresh food compartment is laterally next to the freezer compartment), a standalone refrigerator or freezer, a refrigerator having a compartment with a variable climate (i.e., can be operated as a fresh-food or a freezer compartment), etc.

A fresh-food compartment door 106 and a freezer compartment door 108, shown in FIG. 1, are pivotably coupled to a cabinet 110 of the refrigerator 100 to selectively restrict and grant access to the fresh-food compartment 102 and the freezer compartment 104, respectively. As shown, each of the fresh-food compartment and freezer compartment doors 106, 108, respectively, are single doors that span the entire lateral distance of the fresh-food and freezer compartments 102, 104 respectively. It is to be understood that other configurations are contemplated (e.g., the fresh-food and/or freezer compartments 102, 104 having French-type doors that collectively span the entire lateral distance of the entrance of the fresh-food and/or freezer compartment 102, 104).

The freezer compartment 104 is used to freeze and/or maintain articles of food stored therein in a frozen condition. For this purpose, the freezer compartment 104 is in thermal communication with a freezer evaporator 112 (shown schematically in FIG. 1) that removes thermal energy from the freezer compartment 104 to maintain the temperature therein at a user-selectable target freezer temperature, e.g., a temperature of 0° C. or less during operation of the refrigerator 100, preferably between 0° C. and −50° C., more preferably between 0° C. and −30° C. and even more preferably between 0° C. and −20° C.

The fresh-food compartment 102 serves to minimize spoiling of articles of food stored therein. This is accomplished by maintaining the temperature in the fresh-food compartment 102 at a cool temperature that is typically above 0° C., so as not to freeze the articles of food in the fresh-food compartment 102. It is contemplated that the cool temperature is a user-selectable target fresh-food temperature preferably between 0° C. and 10° C., more preferably between 0° C. and 5° C. and even more preferably between 0.25° C. and 4.5° C. The fresh-food compartment 102 may include a dedicated fresh-food evaporator (not shown) to separately maintain the temperature within the fresh-food compartment 102 independent of the freezer compartment 104. Alternatively, the fresh-food compartment 102 may be in thermal communication with the freezer evaporator 112 such that the freezer evaporator 112 maintains the temperature of the fresh-food compartment 102 at a desired temperature setpoint.

Figure 2A:
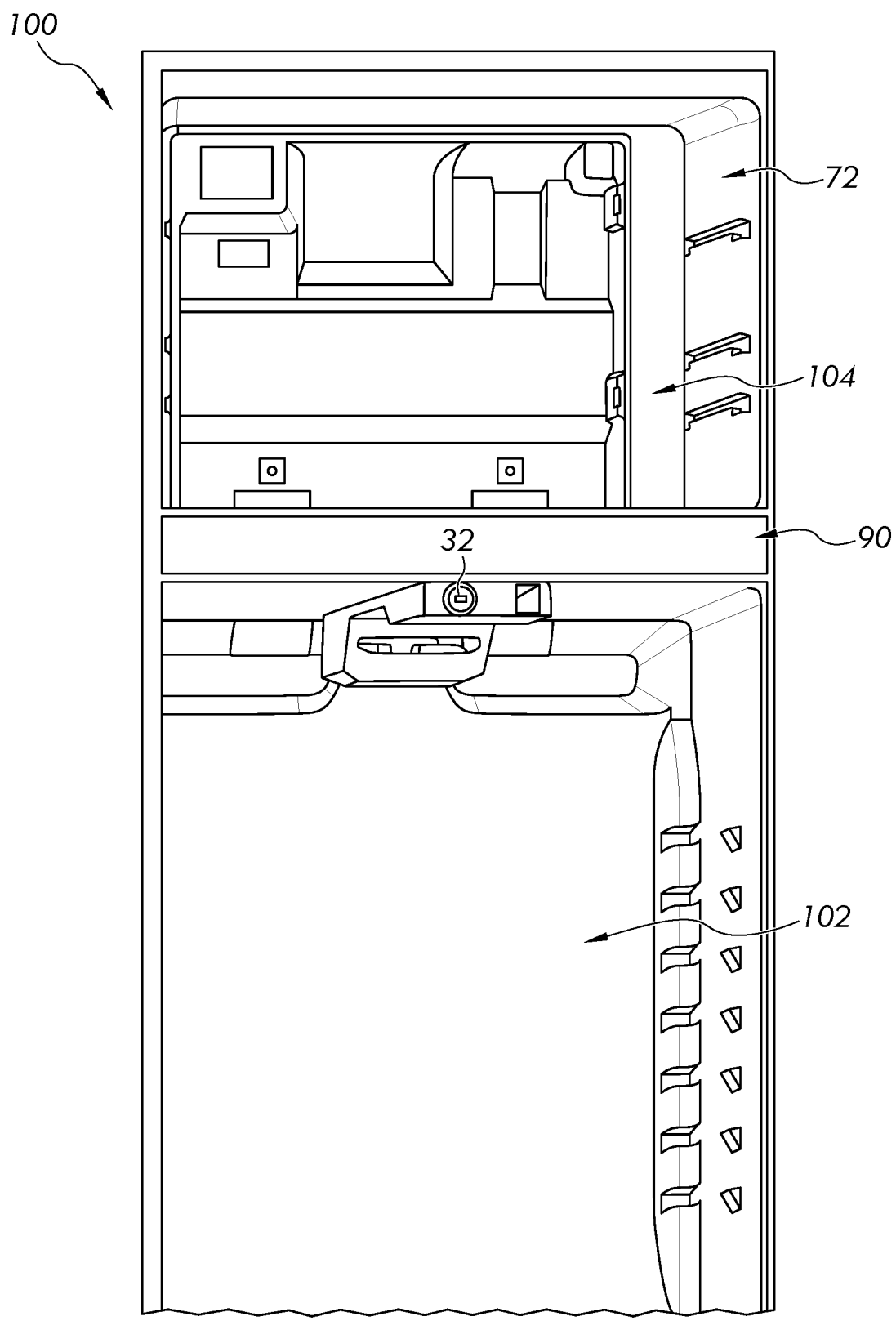
FIG. 2A is a front perspective view of a liner of the refrigerator of FIG. 1, with a user interface.

Referring now to FIG. 2A, the refrigerator 100 includes an interior liner 72 formed to define an upper compartment (e.g., the freezer compartment 104) and a lower compartment (e.g., the fresh food compartment 102). The upper compartment and the lower compartment of the liner 72 are configured such that the air circulated in the upper compartment is maintained separated from the air circulated in the lower compartment.

Figure 2B:
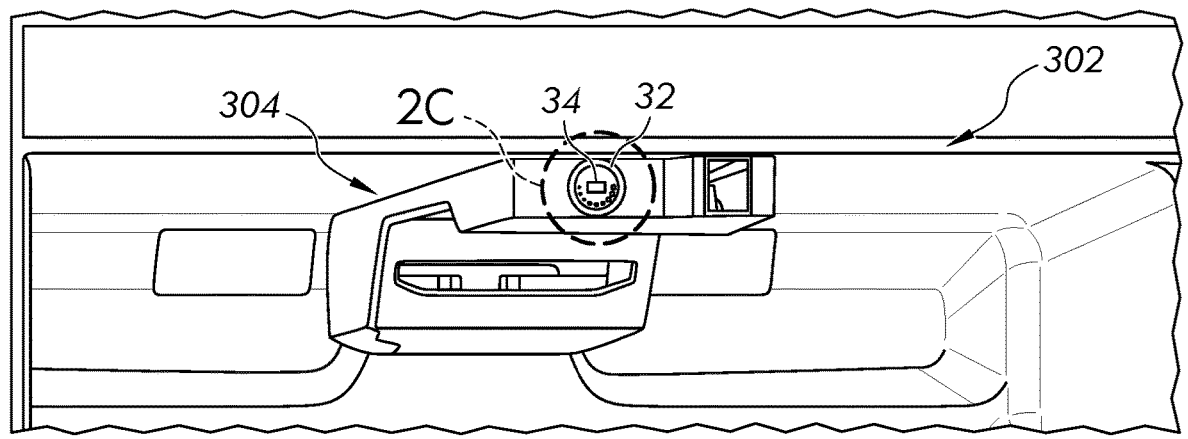
FIG. 2B is a front perspective view of a control box including the user interface of FIG. 2A.
Figure 2C:
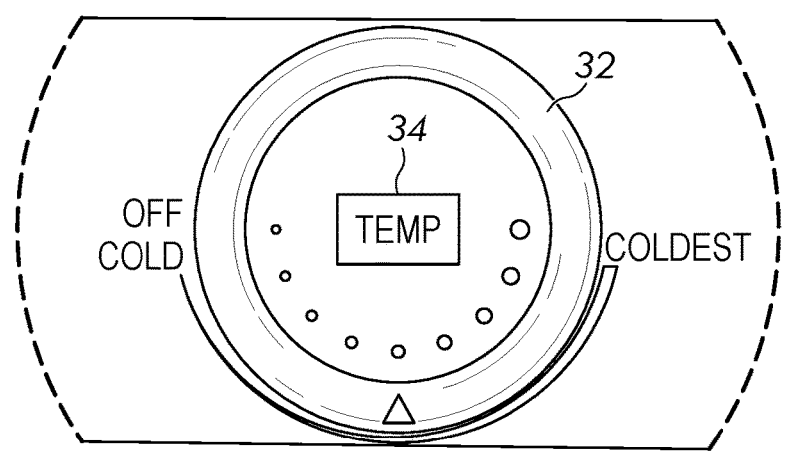
FIG. 2C is an enlarged view of the user interface of FIG. 2A.

Turning now to FIGS. 2A-2C, a user interface 32 can be arranged beneath a top wall 302 of the fresh food compartment 102. In refrigerators where the fresh food compartment 102 is arranged below the freezer compartment 104 (i.e., a top-mount refrigerator as shown in FIGS. 1 and 3A, for example), the user interface 32 can be arranged below a partition 90 that separates the fresh food compartment 102 is arranged below the freezer compartment 104, such that the exterior surface of the user interface 32 is easily accessible by the user to change the compartment temperature when the fresh-food compartment door 106 is opened. When the fresh-food compartment door 106 is in its closed position, the user interface 32 can be substantially hidden from view when the refrigeration appliance 100 is viewed from the front. By substantially hidden from view it is meant that the user interface 32 faces the inner portion of the fresh-food compartment door 106, and does not have a noticeable outward appearance.

In other embodiments, the user interface 32 can be arranged on a side wall of the fresh food compartment 102 facing the inner volume of the fresh food compartment 102 and providing an easy access by the user to manipulate controls on the user interface 32 and change the compartment temperature, or could even be provided on a front or edge of the fresh food and/or freezer door, for example.

As shown in FIG. 2B, the user interface 32 may be a part of a control box assembly 304 configured to be mounted on the top-rear portion of the fresh food compartment liner 72. The user interface 32 is arranged at the front portion of the control box assembly 304 facing the user when the refrigerator door 54 is open. The control box 304 may extend less than the full depth of the fresh food compartment 102, such as about half, for example, allowing more room for placing larger objects in the fresh food section 102 of the refrigerator. The control box 304 may be attached to the top of the fresh food liner 72 utilizing a screw, mechanical clips, or other suitable attachment means. The housing of the control box assembly 304 can be injection molded. In addition to the user interface 32, the housing of the control box assembly 304 can accommodate various components, such as any or all of a cold control assembly that provides temperature control of the fresh food compartment 102, a temperature sensor, a moveable damper that selectively allow or prevents cold air to flow into the fresh food compartment 102, an air diffuser formed at the rear of the control box 304 that mates with a cold-air vent that sends cold air from the freezer compartment 104 into the fresh food compartment 102, a light bulb, a heat shield that protects the housing from over-heating, and a terminal block that enables checking the function of the defrost heater and a timer, for example.

An example of the user interface 32 is illustrated in FIGS. 2A-2C. The user interface 32 can include any suitable elements, such as a printed circuit board, a light guide, an outer fascia, activatable element, light element, a readable electronic display like a LCD, a controller, etc. The user interface 32 shown in FIGS. 2A-2C includes a single-button 34 actuated via a capacitive touch that replaces the known analogue potentiometer dial with a new digital solution. User touch sequences, solely via the single capacitive-touch button 34, select compartment temperatures or special refrigerator modes, such as Sabbath or vacation mode, for example. The single capacitive-touch button 34 is electrically connected to a user interface controller 604, such as a microprocessor, for example, via wires, printed circuits, flex cables, or the like. The controller 604 can interpret the signals from the single capacitive-touch button 34 to determine the user action, as described in further detail below. To indicate to the user what temperature setting or special mode has been selected, a plurality of light-emitting diodes (LED) indicators arranged on the single capacitive-touch button 34, as described below, are progressively energized to represent a different temperature or special mode setting. Visual textual description, such as "OFF", cold, or coldest, for example (best shown in FIG. 2C) may be provided around the user interface 32 to further illustrate the modes represented by the illuminated LED indicators.

The user interface controller is a dedicated controller, which is separate from the main control board (or main controller) 114 of the refrigerator control system (shown in FIG. 1) that is used substantially only for controlling the operations of the appliance. The main controller 114 in FIG. 1 is illustrated on the back wall of the refrigerator. However, the main controller 114 may be located in various locations throughout the refrigerator (e.g., in the ceiling or bottom wall or rear external wall of the refrigerator, etc.)

The user interface controller can include one or more microprocessors, a microcontroller, a digital signal processor (DSP), an application specific integrated circuit (ASIC), a field-programmable gate array (FPGA), discrete logic circuitry, or the like. The user interface controller can further include at least one timer that keeps track of, or counts, various time intervals described herein. The user interface controller can also include memory and may store program instructions that, when executed by the user interface controller, cause the user interface controller to provide the functionality ascribed to it herein. Specifically, the user interface controller can be programmed to control the operations of the user interface 32. The memory may store different predetermined temperature values corresponding to the number of press-touches and releases of the single capacitive-touch button 34, as described below. The memory may include one or more volatile, non-volatile, magnetic, optical, or electrical media, such as read-only memory (ROM), random access memory (RAM), electrically-erasable programmable ROM (EEPROM), flash memory, or the like. The user interface controller can further include one or more analog-to-digital (A/D) converters for processing various analog inputs to the user interface controller.

The user interface controller can include input/output circuitry for interfacing with the various system components. For example, the user interface controller can receive as input signals, and interpret, the number of press-touches and releases of the single capacitive-touch button 34, and door switch input for the status of the appliance door. Outputs of the user interface controller can be parameters related to the temperature of the refrigeration compartments, or parameters used to activate and deactivate specific refrigerator control functions, such as Sabbath mode or vacation mode, as described in detail below.

Figure 3:
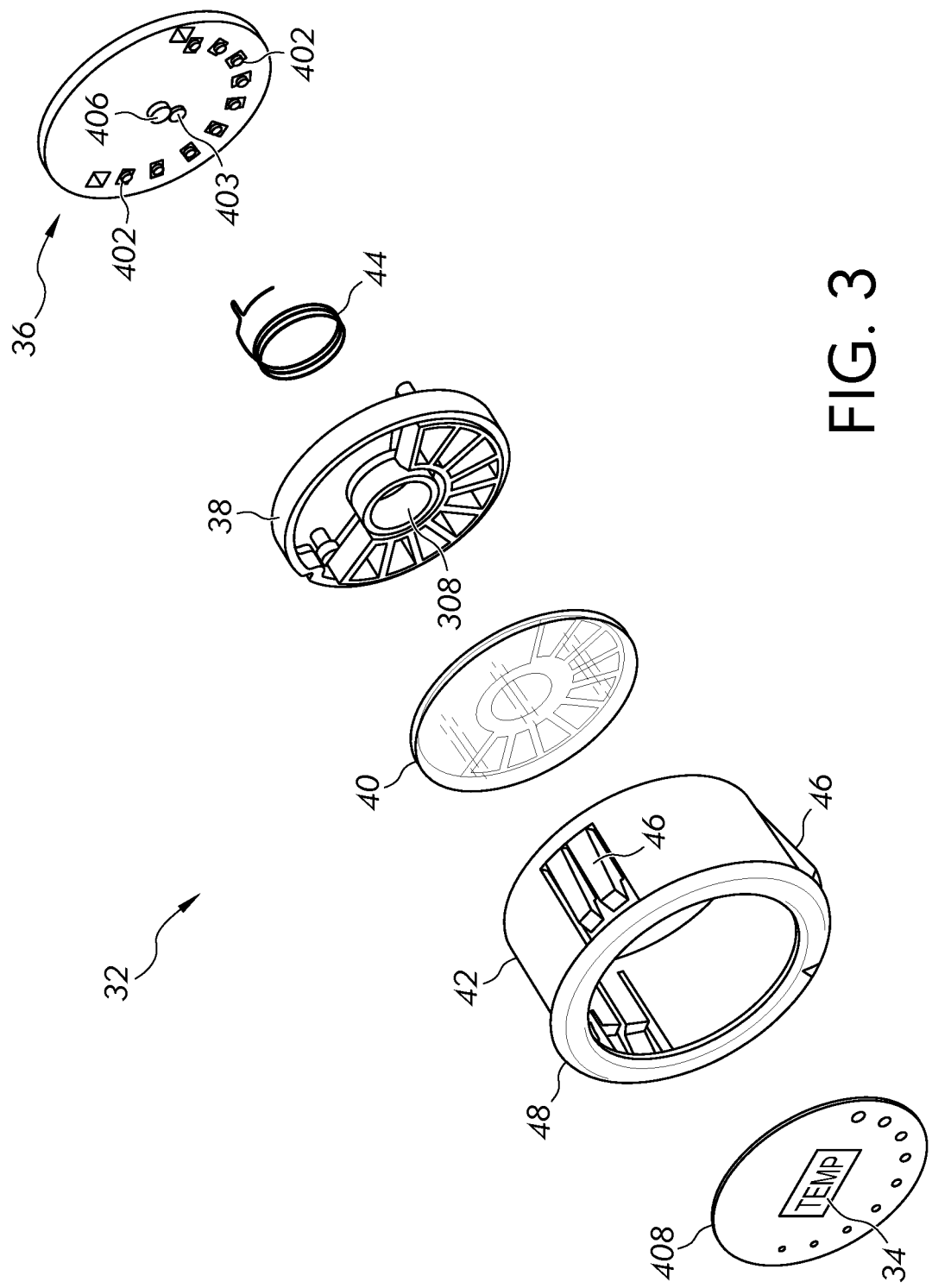
FIG. 3 is an expanded view of a single-button capacitive sensor assembly.

FIG. 3 is an expanded view of a single-button capacitive sensor assembly 32. The sensor assembly 32 is a stacked assembly including a decorative graphic outer panel 408, a user interface (UI) carrier 42, a graphic overlay 40, a light guide 38, a capacitive touch spring 44, and a printed circuit board (PCB) 36. When the single-button capacitive sensor assembly 32 is assembled, each of the PCB 36, the light guide 38, the graphic overlay 40, and the decorative graphic panel 408 are received into the UI carrier 42.

In a fully assembled state of the single-button capacitive sensor assembly 32, the graphic overlay 40 is disposed over the light guide 38 and the decorative graphic panel 408 is arranged over the graphic overlay 40. The decorative graphic panel 408 provides the outermost surface of the sensor assembly 32. That is, the decorative graphic panel 408 is the front surface of the sensor assembly 32 that is engaged by the user's finger. The decorative graphic panel 408 provides outwardly visible graphics for the user and also can be tinted to enable particularly colored lit-indicators. The decorative graphic panel 408 and the graphic overlay 40 are electrical insulators, which act as a dielectric between the user's finger and the copper electrode of the self-capacitive electrode touch sensor 406. The decorative graphic panel 408 and the graphic overlay 40 also act as a protective front membrane layer for the electronics and reduce scattered edges or diffused light at the LEDs.

The activatable element of the sensor assembly 32 is a capacitive-touch button 34 (i.e., electric capacitive touch button) which can be capacitively electrically controlled through the graphic outer panel 408 via contact of the user, such as via the user's finger. The self-capacitive touch button 34 can be a self-capacitive touch sensor (capacitive proximity sensor) that can detect touch or near proximity, without relying on physical contact. A self-capacitive touch sensor measures changes in capacitance with respect to earth ground. A touch, e.g., by the user's finger, causes the electrode capacitance to increase because the human body adds capacitance to the existing capacitance of the self-capacitive touch system. In other words, when the user's finger touches the self-capacitive touch button 34, capacitances are formed between the user's finger, which is at a reference potential, and the opposite sensor surface. A controller can evaluate the current signal to activate a respective temperature or special refrigeration mode setting, and to energize and illuminate the respective LED indicators 402 (shown in FIG. 3).

The capacitive-touch button 34 can be indicated with a visual signage "TEMP" to easily indicate to the user the area that is sensitive to a touch by the user's finger. The capacitive-touch button 34 can be formed as a panel of a sufficiently thin layer so as to be sufficiently transparent. Because the capacitive-touch button 34 is light-transmitting, the RGB LED 403 (shown in FIG. 3) disposed beneath the capacitive-touch button 34 can be readily visible through the transparent capacitive-touch button 34 when energized.

Referring again to FIG. 3, the PCB 36 assembly has nine blue or white colored LEDs 402 arranged circumferentially in the bottom half portion of the front side of the PCB 36, one RGB (red, green, and blue) LED 403 arranged in the center of the PCB 36, and a self-capacitive electrode touch sensor 406 positioned at the front side of the PCB 36. The self-capacitive electrode touch sensor 406 can be a copper electrode constructed on a FR4 PCB material, such as flame retardant and woven glass reinforced epoxy resin, for example. The self-capacitive electrode touch sensor 406 has a free-space coupling capacitance to earth ground. The RGB LED 403 is arranged in close proximity to the self-capacitive electrode touch sensor 406, such that when the sensor assembly 32 is assembled, the RGB LED 403 illuminates the self-capacitive touch button 34 in different colors, depending on the user's selection via the user interface 32. The LEDs 402 and the RGB LED 403 are connected to the PCB 36 via circuitry printed on the bottom side of the PCB 36. The PCB 36 can include at least one digital-to-analog circuit that outputs a variable analog signal to the main system board of the refrigerator, similar to the signals the main system board receives from a conventional potentiometer user interface.

The capacitive touch spring 44 is arranged in direct contact with the rear surface of the light guide 38 and the front side of the PCB 36. The capacitive touch spring 44 is configured to be accommodated inside a groove 308 formed in the light guide 38 and extend to the front portion of the light guide 38 (e.g., the portion facing the graphic overlay 40), to ensure that there is no leakage of light and to ensure that there is a good connection between the light guide 38 and the graphic overlay 40 for better touch execution when the capacitive-touch button 34 is touched by the user.

The UI carrier 42 is generally cylindrical and includes a plurality of spring clips 46 disposed about its outer periphery. A front mounting flange 48 is disposed circumferentially about the front face of the UI carrier 42, and extends radially and outwardly from the cylindrical main body of the UI carrier 42 having the spring clips 46.

The internal surface of the UI carrier 42 can include one or more locating ribs 50 (best shown in FIG. 4) against which the PCB 36 can be set, to align the PCB 36, the light guide 38, and the graphic overlay 40 within the UI carrier 42 parallel to the front face of the UI carrier 42. An electrical connector 502 is attached to the rear side of the PCB 36 for supplying power and/or to provide data connection between the main controller 114 of the refrigerator and the PCB 36, and thereby to the sensor assembly 32.

Figure 4:
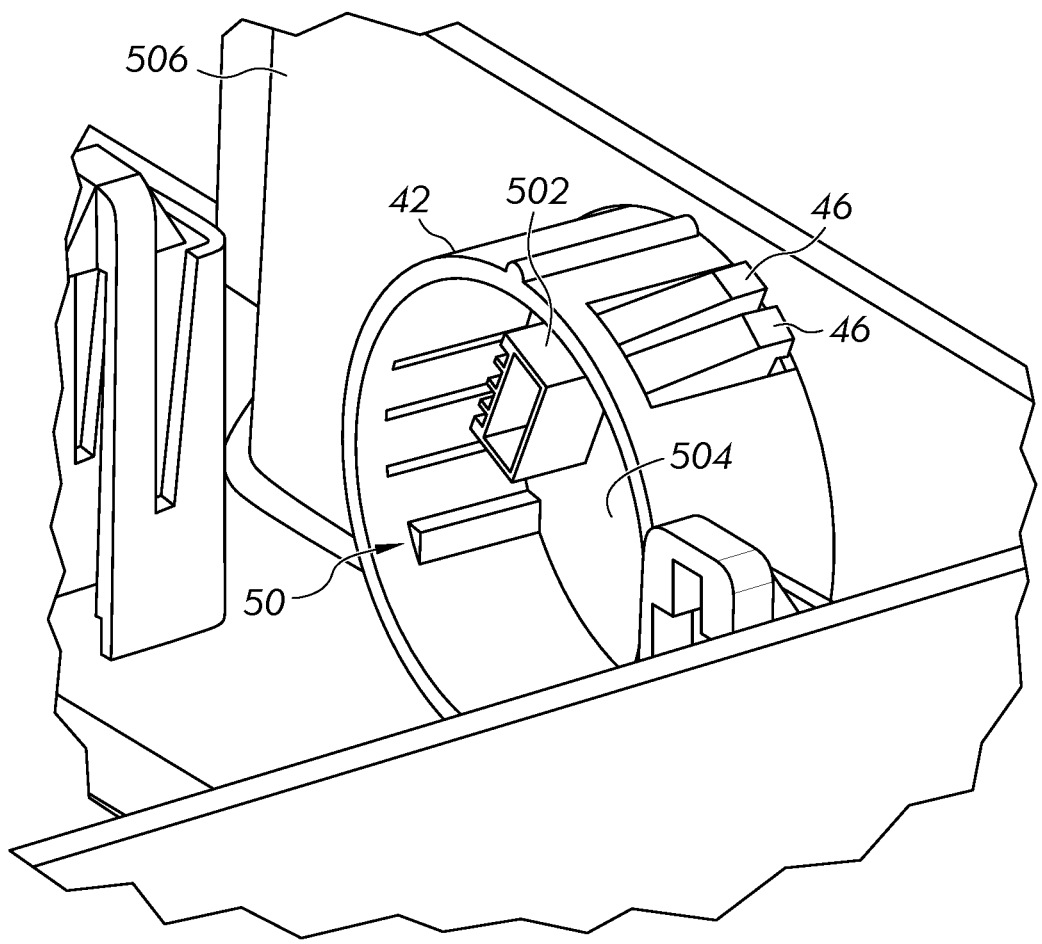
FIG. 4 is a partial view of a single-button capacitive sensor assembly arranged in a sensor housing.

As shown at FIG. 4, the assembled sensor assembly 32 is configured to be received into a corresponding through-hole 504 at the sensor housing 506. The UI carrier 42 is pushed into and snapped into the through-hole 504, with the spring clips 46 and the front mounting flange 48 engaging at opposite (external and internal) sides of the sensor housing 56. The sensor housing 506 may be a part of the control box assembly 304 (shown in FIG. 3B) and can be located at any suitable location within a compartment of the appliance, such as at the ceiling of the fresh food compartment 102 (as shown in FIG. 1), on the top-rear portion of the fresh food compartment liner 72, or at a side wall of the fresh food compartment 102, for example.

Figure 5A:
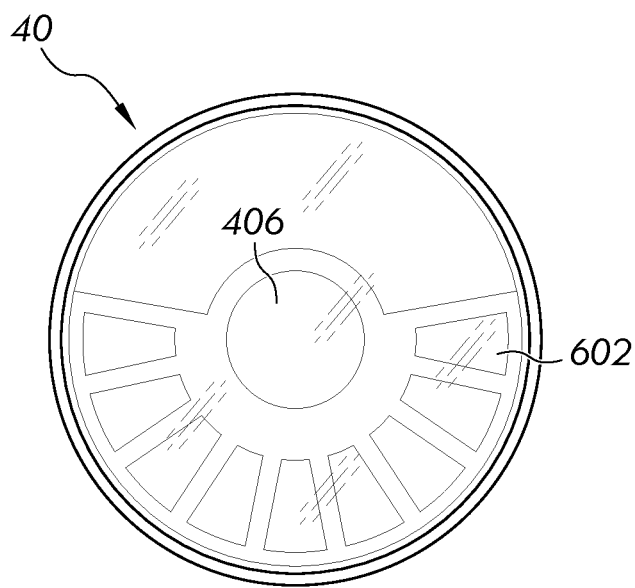
FIGS. 5A-5C illustrate details of the light guide and the decorative graphic outer panel of the single-button capacitive sensor assembly of FIG. 3.
Figure 5B:
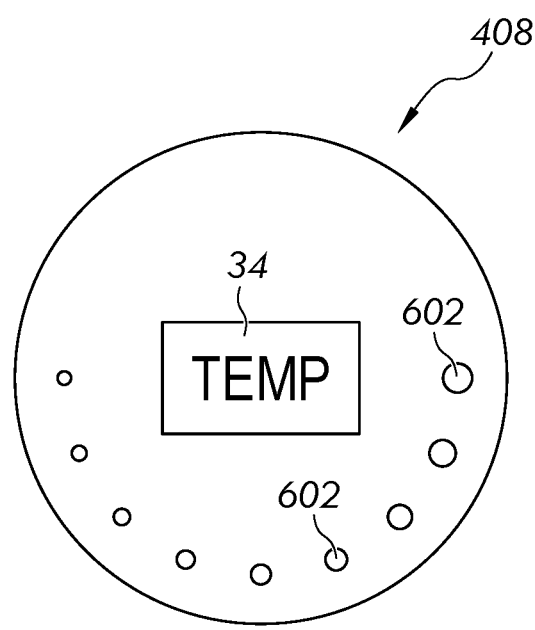
Figure 5C:
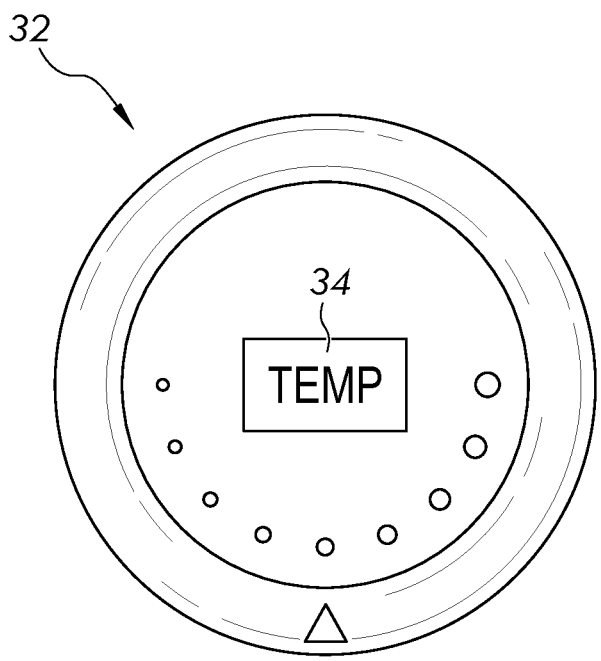

Turning now to FIGS. 5A and 5B, the sensor assembly 32 is shown in a partial-assembled state with the graphic overlay 40 omitted. The light guide 38 aids in directing the light from the LEDs 402 at the PCB 36, to thereby reduce blurry edges and to provide distinct and separated light indicators for the user. The light guide 38 has a series of pockets or windows 602 for each of the LEDs 402 to eliminate light leakage or light mixing therebetween. The LEDs 402 are received at the windows 602 disposed through the light guide 38.

As shown in FIG. 5B, round openings 602 corresponding to the windows 602 disposed through the light guide 38 may be formed on the decorative graphic outer panel 408. The round openings 602 on the decorative graphic outer panel 408 may vary in size from the smallest in the leftmost side of the decorative graphic outer panel 408 to the largest in the rightmost side of the decorative graphic outer panel 408. This variation is size can be used to provide an increased intensity of illumination (or darker color, as described below) of the LEDs 402, indicating the variation in temperature settings from the least cold setting at the leftmost side of the decorative graphic outer panel 408 to the coldest temperature setting in the rightmost side of the decorative graphic outer panel 408.

Figure 6:
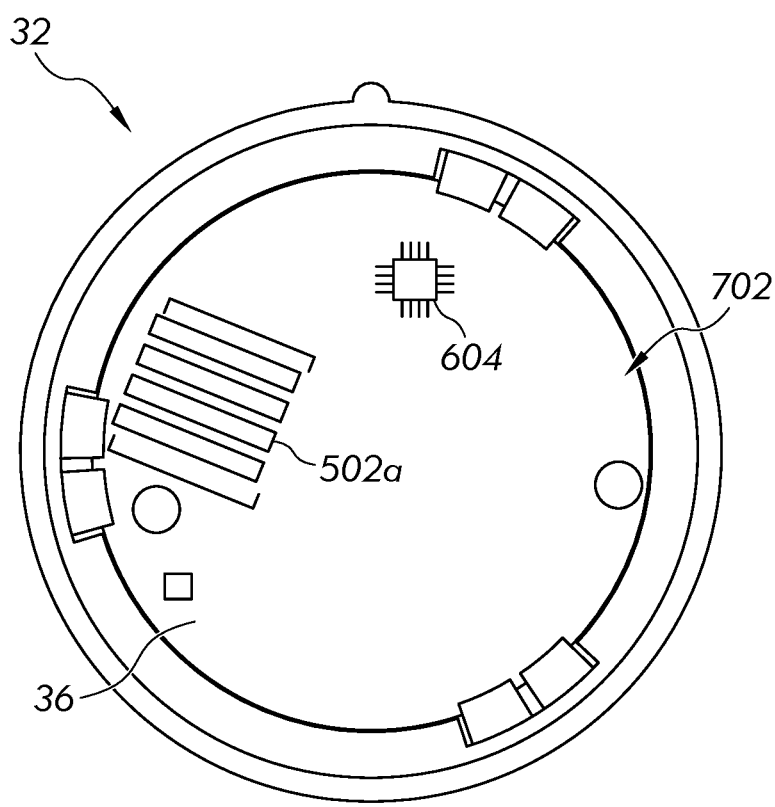
FIG. 6 is a rear view of the printed circuit board of the single-button capacitive sensor assembly of FIG. 3.

Turning to FIG. 6, various controls (control circuits) are mounted or printed on the rear side 702 of the PCB 36 facing oppositely of the light guide 38 and inwardly towards a rear of the respective compartment, when the sensor assembly 32 is aligned at the sensor housing. A user interface microcontroller 604 and the pads 502a of the connector 502 (shown in FIG. 4) that connects the user interface microcontroller 604 and the main controller 114 of the refrigerator are also shown.

Figure 7:
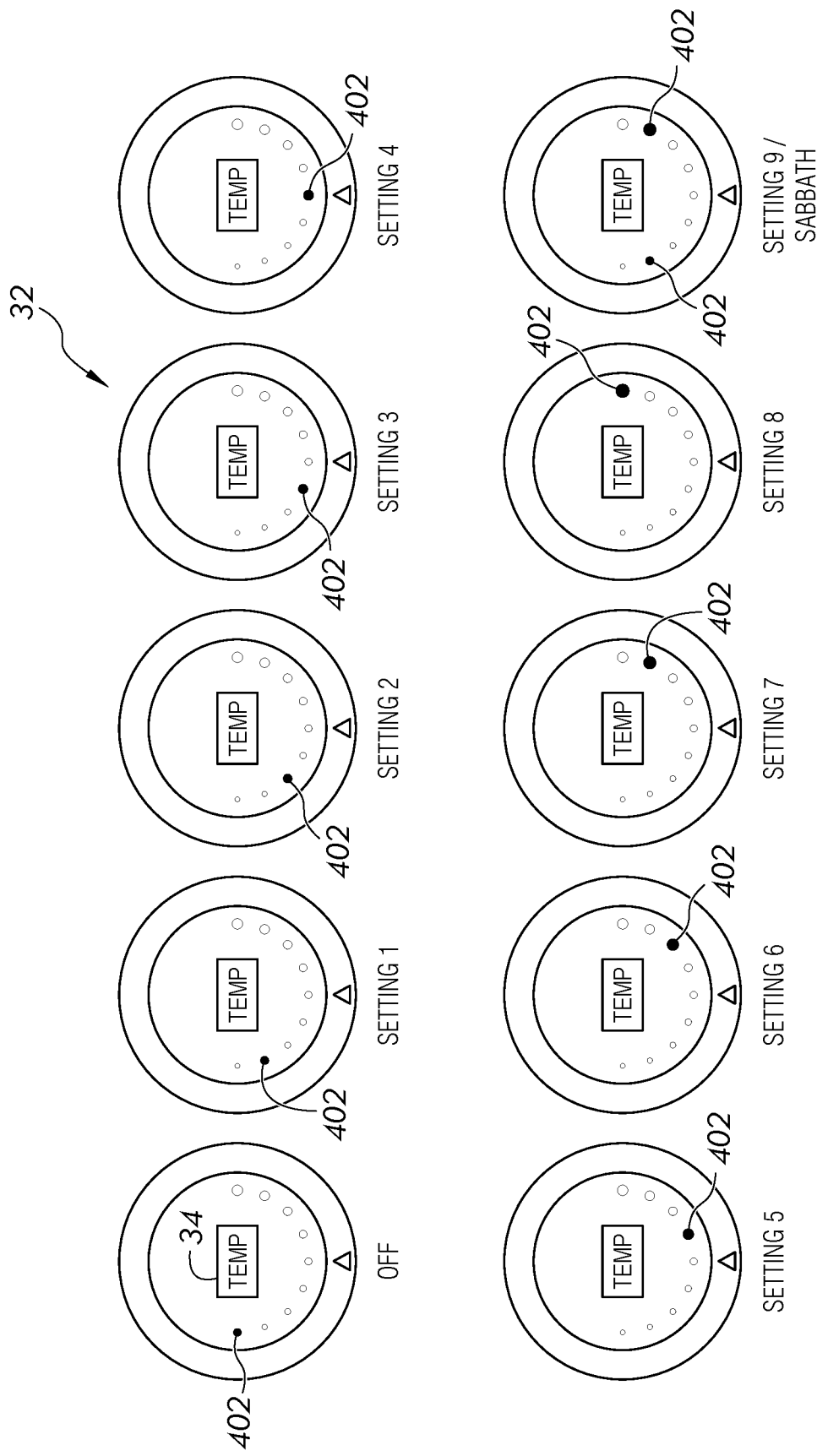
FIG. 7 depicts various lit states of the single-button capacitive sensor assembly of FIG. 3.

FIG. 7 depicts various lit states of the sensor assembly 32. The self-capacitive touch button 34 is activated when the user touches the front surface of the decorative graphic outer panel 408. The control circuits at the PCB 36 then activate the respective LED indicator 402 in response to the user's touch. As shown in FIG. 7, each successive touch by the user's finger cycles the temperature set point through Settings 1, 2, 3, 4, 5, 6, 7, and 8, which illuminates the successive corresponding LEDs 402 on the sensor assembly 32, and thus causes the main refrigeration controller 114 to activate a successive pre-defined temperature set point.

Different LED colors and shades can correspond to different cold temperature settings, transitioning from a light blue (less cold) to a darker blue (coldest). In one embodiment, the LEDs 402 can be multi-color LEDs, such as RGB (Red, Green, Blue) LEDs capable of emitting red, green and blue light. The RGB LEDs 402 can be utilized to emit different colors with different brightness/intensity levels rendered as combinations of the aforementioned primary colors. The RGB color model is additive in the sense that the three light beams are added together, and their light spectra sum, wavelength for wavelength, to make the final color's spectrum. For example, mixing two of the primary colors red, green and blue may result in secondary colors where two of the primary colors overlap (e.g., yellow from red and green, magenta from red and blue, and cyan from green and blue), while the combination of all three primary colors in equal intensities will produce white light. Depending on the brightness level of the participating primary color components, the resulting color may be more saturated or less saturated. When one of the primary color components has the highest brightness level, the resulting color may be a hue near that primary color (e.g., reddish, greenish, or bluish), and when two color components have the same brightness level, then the resulting color may be a hue of the respective secondary color (e.g., a shade of yellow, magenta, or cyan). When the brightness level for all participating color components is the same, the result may be a shade of gray, which may be darker or lighter depending on the brightness level of the participating primary colors.

A color in the RGB color model can be described by indicating how much of each of the red, green, and blue color is included. The color is expressed as an RGB triplet, each component of which can vary from zero to a defined maximum value. If all the components are at zero the result is black; if all are at maximum, the result is the brightest representable white. Each color component value can be represented as a percentage, from 0% to 100%. The table below provides examples of different brightness levels combinations of the primary colors red, green, and blue, which can be used in the LEDs 402:

| Brightness Level | Red (%) | Green (%) | Blue (%) |
|---|---|---|---|
| 1 | 100 | 100 | 0 |
| 2 | 100 | 50 | 0 |
| 3 | 100 | 25 | 25 |
| 4 | 75 | 25 | 75 |
| 5 | 75 | 0 | 50 |
| 6 | 75 | 0 | 25 |
| 7 | 50 | 0 | 0 |
| 8 | 0 | 0 | 50 |
| 9 | 0 | 0 | 25 |
| 10 | 0 | 0 | 0 |

For example, blue (B) color can be used for temperatures between 0.25° C. and 4.5° C. The reduced selected temperature of the refrigeration compartment may be displayed by gradually increasing a particular color of the LEDs 402, e.g., transitioning from a light blue color (for less cold temperatures of 4.5° C.) to a darker blue color (for the coldest temperature between 0° C. and 0.25° C.). In certain embodiments, an LED 402 lit in white may be utilized to indicate to the user that the current temperature of the refrigeration compartment has reached a target temperature selected by the user on the user interface 32.

To turn off the unit, the user presses and holds the self-capacitive touch button 34 for 3 or more seconds, which turns off the sensor assembly 32. If the user keeps pressing the self-capacitive touch button 34 for more than 3 seconds, the RGB LED 403 (arranged underneath the self-capacitive touch button 34) will starts blinking (indicating an OFF mode). A red shade of the RGB LED 402 can indicate the OFF state of the sensor assembly 32. Of course, the amount of time required to hold the button 34 to achieve different effects can be set at different values.

A quick press-touch and release by the user on the self-capacitive touch button 34 corresponds to temperature Setting 1, which may be a less cold setting (e.g., temperature around 4.5° C.) for the refrigeration compartment. Subsequent quick press-touch and release by the user on the self-capacitive touch button 34 corresponds to consecutive temperature Settings 2, 3, 4, 5, 6, 7, and 8, which may vary from a slightly colder setting for the refrigeration compartment compared to Setting 1 to the coldest possible setting (i.e., the lowest temperature set point between 0° C. and 0.25° C.). The selected temperature Settings 2, 3, 4, 5, 6, 7, and 8 may be visualized to the user by gradually increasing the a particular color, e.g., transitioning from a light blue color (for less cold temperatures of 4.5° C.) to a darker blue color (for the coldest temperature between 0° C. and 0.25° C.).

After cycling through Settings 1, 2, 3, 4, 5, 6, 7, 8, and 9, the cycle continues again to Setting 1. The LEDs 402 provide clear feedback for the control set point for the user.

Turning again to FIG. 7, the Setting 9 can be used by the user to activate and deactivate special refrigerator control modes, such as a Sabbath mode or vacation mode, for example. In particular, the Sabbath mode disables certain functions of the refrigerator and controls other functions in accordance with the observance of the weekly Sabbath and religious holidays within the Orthodox Jewish community. During the Sabbath mode, the adaptive defrost mode of the refrigerator evaporator(s) is disabled and the operation of the compressor and the fans (e.g., fresh food evaporator fan, freezer evaporator fan, variable climate zone (VCZ) fan, condenser fan, etc.) is delayed. The compressor and the fans will not change their states (will not turn ON or OFF) or vary their speeds for a predetermined time delay (e.g., between 20 and 60 seconds) after any door opening of a compartment, a such as the fresh food compartment, the freezer or the variable climate zone (VCZ). After expiration of the delay between any door opening, the compressor and the fans' states or speed can change.

To enable the Sabbath mode using the user interface 32, the user will open the refrigerator door 54 and will continuously press (without releasing) the self-capacitive touch button 34 on the user interface 32 for a predetermined time duration, e.g., for a 5 seconds or longer. An indication to the user that the Sabbath mode was enabled will be provided by turning ON two of the LEDs 402, e.g., the second and the eighth LED 402, as shown in Setting 9 of FIG. 7.

Optionally, an additional indication to the user that the Sabbath mode was enabled may be provided by turning OFF the interior lights in the refrigerator compartment and/or by emitting an audio tone.

To disable the Sabbath mode using the user interface 32, the user will continuously press (without release) the self-capacitive touch button 34 for a predetermined time duration, e.g., for 5 seconds or longer, which will restore the previous (e.g., normal) temperature (or other) settings of the refrigerator. An indication to the user that the Sabbath mode was disabled will be provided by turning OFF the LEDs 402 or by illuminating one LED 402 in red, as shown in the OFF setting of FIG. 7.

Optionally, an additional indication to the user that the Sabbath mode was disabled may be provided by turning ON the interior lights in the refrigerator compartment.

The control Settings 1 through 9, described above can operate in a normal control mode, low power mode, and a stop (OFF) mode. The single capacitive-touch button 34 can be used as a drop-in replacement for an existing main system board, allowing the sensor assembly 32 to replace the conventional dial/potentiometer assembly.

Compared to the conventional temperature analogue potentiometer dials, the digital solution of the single capacitive-touch button assembly 32 includes no mechanically moving parts that may be susceptible to wear, and thus improves the reliability and extends the life of the user interface 32.

The invention has been described with reference to the example embodiments described above. Modifications and alterations will occur to others upon a reading and understanding of this specification. Example embodiments incorporating one or more aspects of the invention are intended to include all such modifications and alterations insofar as they come within the scope of the appended claims and their equivalents.

What is claimed is:

1. A refrigeration appliance, comprising:
a storage compartment;
a refrigeration system operable to cool the storage compartment;
a main controller; and
a user interface arranged in the storage compartment, said user interface comprising a stacked arrangement including:
a sensor assembly carrier,
a graphic overlay,
a light guide, and
a printed circuit board (PCB) with a self-capacitive electrode sensor and
a user interface controller, comprising a single capacitive touch button configured to receive a touch or proximity input from a user relating to control of a temperature setting of the storage compartment,
wherein the main controller:
receives a signal from the user interface controller indicative of said touch or proximity input,
adjusts the temperature setting of the storage compartment, within a range of a lowest temperature setting to a highest temperature setting, based on a number of consecutive touch or proximity inputs to the single capacitive touch button,
wherein each consecutive touch or proximity input causes the temperature setting to increase from a lower temperature setting to a next-higher temperature setting, and
wherein when the next-higher temperature setting is the highest temperature setting, the next consecutive touch or proximity input causes the temperature setting to return to the lowest temperature setting; and
operates the refrigeration system to cool the storage compartment to a temperature corresponding to the selected temperature setting.

2. The refrigeration appliance of claim 1, wherein the self-capacitive electrode sensor is operatively connected to the single capacitive touch button.

3. The refrigeration appliance of claim 2, wherein the PCB comprises electrical circuitry that receives the touch or proximity input via the single capacitive touch button and transmits the touch or proximity input via a communication channel to the main controller for controlling an operation of the refrigeration system.

4. The refrigeration appliance of claim 2, wherein an electrical connector is attached to a rear side of the PCB for supplying power and for providing data connection to the PCB and to the single capacitive touch button.

5. The refrigeration appliance of claim 1, wherein the user interface further comprises a plurality of light-emitting diode (LED) indicators configured to display at least one of the temperature setting or a special mode of the refrigeration appliance.

6. The refrigeration appliance of claim 5, wherein the special mode of the refrigeration appliance is a Sabbath mode.

7. The refrigeration appliance of claim 5, wherein the user interface controller is further configured to evaluate the signal from the self-capacitive electrode sensor and illuminate at least one of the plurality of LED indicators corresponding to the temperature setting or to the special mode of the refrigeration appliance.

8. The refrigeration appliance of claim 1, wherein the stacked arrangement of the user interface further comprises a transparent outer panel and at least one LED indicator arranged below the transparent panel.

9. The refrigeration appliance of claim 1, wherein the PCB is jointly received within an inner circumference of the sensor assembly carrier.

10. The refrigeration appliance of claim 1, wherein the sensor assembly carrier is snapped into a housing arranged in the storage compartment.

11. The refrigeration appliance of claim 1, wherein the stacked arrangement further includes a capacitive touch spring arranged between the light guide and the PCB so that the capacitive touch spring contacts the light guide.

12. The refrigeration appliance of claim 11, wherein the capacitive touch spring is accommodated inside a groove formed in the light guide and extends to a front portion of the light guide, said front portion facing the graphic overlay.

13. The refrigeration appliance of claim 1, wherein the sensor assembly carrier has a cylindrical shape, wherein a plurality of spring clips are arranged about an outer periphery of the sensor assembly carrier.

14. The refrigeration appliance of claim 1, wherein the sensor assembly carrier includes at least one locating rib align the PCB, the light guide, and the graphic overlay parallel to a front face of the sensor assembly carrier.

15. A method for controlling a refrigeration appliance, wherein the refrigeration appliance comprises a storage compartment, a main controller, and a stacked user interface including a single capacitive touch button, a plurality of light-emitting diode (LED) indicators, and a user interface controller, the method comprising the steps of:
consecutively touching, by a user's finger, the single capacitive touch button to select at least one of a temperature setting or a special mode setting for the storage compartment;
transmitting, by the user interface controller to the main controller, signals from the user interface single capacitive touch button;
activating, by the main controller, a desired temperature setting or a special mode setting for the storage compartment based on the signals from the user interface single capacitive touch button, wherein the consecutive touching causes the temperature setting to increase from a low temperature setting to a high temperature setting, and wherein when a next-high temperature setting is a highest temperature setting, then the next consecutive touching of the single capacitive touch button causes the temperature setting to return to a lowest temperature setting; and
energizing, by the user interface controller, at least one LED indicator of the plurality of LED indicators to visualize a selected temperature setting or special mode setting for the storage compartment,
wherein each consecutive touching corresponds to a predetermined temperature setting or special mode setting and energizes at least one successive corresponding LED indicator on the stacked user interface.

16. The method of claim 15, wherein each predetermined temperature setting corresponds to a different shade of color or intensity of illumination of the at least one successive corresponding LED indicator.

17. The method of claim 15, wherein the special mode is a Sabbath mode.

18. The method of claim 17, wherein the user interface controller activates or deactivates the Sabbath mode in response to a continuous pressing, by the user's finger, of the single capacitive touch button, for a predetermined time duration.

19. A refrigeration appliance, comprising:
a storage compartment;
a main controller; and
a user interface integrated into a control box mounted in a top portion of the storage compartment, the control box having an adjustable vent that allows cold air from an adjacent compartment into the storage compartment to adjust a temperature of the storage compartment, said user interface comprising a stacked arrangement including:
a sensor assembly carrier,
a graphic overlay,
a light guide, and
a printed circuit board (PCB) with a self-capacitive electrode sensor comprising a single capacitive touch button configured to receive at least one touch or proximity input from a user relating to selection of a temperature setting of the storage compartment within a range of a lowest temperature setting to a highest temperature setting, the selected temperature setting based on a number of touch or proximity inputs to the single capacitive touch button; and
a user interface controller, wherein the main controller receives a signal from the user interface controller indicative of said at least one touch or proximity input and operates the adjustable vent to adjust the temperature in the storage compartment based on the selected temperature setting.

20. The refrigeration appliance of claim 19, wherein the adjacent compartment comprises an evaporator to cool air, wherein the adjacent compartment is located above the storage compartment and the evaporator is in fluid communication with the adjustable vent.

* * * * *